United States Patent
Kato

(10) Patent No.: US 7,038,395 B2
(45) Date of Patent: May 2, 2006

(54) ORGANIC EL DISPLAY DEVICE

(75) Inventor: Naoki Kato, Kanagawa (JP)

(73) Assignee: OPTREX Corporation, Tokyo (JP)

( * ) Notice: Subject to any disclaimer, the term of this patent is extended or adjusted under 35 U.S.C. 154(b) by 0 days.

(21) Appl. No.: 10/996,431

(22) Filed: Nov. 26, 2004

(65) Prior Publication Data

US 2005/0116658 A1    Jun. 2, 2005

(30) Foreign Application Priority Data

Nov. 28, 2003  (JP) ............................ 2003-400098

(51) Int. Cl.
*G09G 3/10* (2006.01)
(52) U.S. Cl. .............................. 315/169.3; 315/169.1; 345/44; 345/48; 345/80; 313/506; 313/519
(58) Field of Classification Search .. 315/169.1–169.3, 315/167; 345/44–48, 55, 76, 77, 80, 84, 345/214, 215; 313/505, 506, 519, 520

See application file for complete search history.

(56) References Cited

U.S. PATENT DOCUMENTS

| | | | |
|---|---|---|---|
| 6,337,542 B1* | 1/2002 | Hanaki et al. ............ | 315/169.3 |
| 6,667,791 B1* | 12/2003 | Sanford et al. ............. | 349/139 |
| 2005/0162076 A1* | 7/2005 | Kato ........................... | 313/504 |
| 2005/0242747 A1* | 11/2005 | Kato et al. ................ | 315/169.3 |
| 2005/0264180 A1* | 12/2005 | Kato ........................... | 313/503 |

FOREIGN PATENT DOCUMENTS

| | | |
|---|---|---|
| JP | 6-20774 | 1/1994 |
| JP | 2003-282253 | 10/2003 |

* cited by examiner

*Primary Examiner*—Haissa Philogene
(74) *Attorney, Agent, or Firm*—Oblon, Spivak, McClelland, Maier & Neustadt, P.C.

(57) ABSTRACT

At a wire crossover portion, extension wires, which are electrically connected to scanning electrode connecting wires, extend so as to cross over the other scanning electrode circuitous wires without having contact with the other scanning electrode circuitous wires and to be electrically connected to the corresponding scanning electrode circuitous wire. Thus, it is possible to ensure routes for leading out respective scanning electrodes without having contact with other wires, and it is possible to collectively apply a voltage for an aging treatment to the respective routes. Portions, where the extension wires extend so as to cross over, are formed in the same step as a step for forming a cathode layer as the scanning electrodes.

6 Claims, 7 Drawing Sheets

ORGANIC EL DISPLAY DEVICE

BACKGROUND OF THE INVENTION

1. Field of the Invention

The present invention relates to an organic EL display device, which is capable of being effectively subjected to an aging treatment.

2. Description of the Related Art

Organic EL (Electroluminescence) display devices are current-drive display devices, which emit light by themselves when a current is supplied to the organic EL layers interposed between an anode and a cathode provided so as to be opposite each other. The organic EL display devices are also called organic LEDs because of having characteristics similar to semiconductor light emitting diodes.

The organic EL devices have such a structure that a plurality of anode strips, which is connected to an anode or forms an anode per se, is provided on a glass substrate in parallel with each another, that a plurality of cathode strips, which is connected to a cathode or forms a cathode per se, is provided in parallel with each another and in a direction orthogonal to the anode strips, and that organic EL layers are interposed between both sets of electrode strips. In organic EL devices wherein the anode strips and the cathode strips are provided in a matrix pattern, each of pixels is formed by the intersection of an anode strip and a cathode strip. In other words, the pixels are provided in a matrix pattern. In general, the cathode strips are made of metal, and the anode strips are made of a transparent conductive layer of, e.g., ITO (indium/tin/oxide).

When the organic EL devices wherein the anode strips and the cathode strips are provided in a matrix pattern are driven by passive matrix addressing, the electrodes in one of the set of anode strips or the set of cathodes strips serves as scanning electrodes, and the electrodes in the other set serve as data electrodes. The scanning electrodes are connected to a scanning electrode driving circuit including a constant-voltage circuit in order to drive scanning electrodes at a constant voltage. The data electrodes are connected to a data electrode driving circuit having a constant-current circuit provided at an output stage. In synchronization with scanning, the respective data electrodes are supplied with a current, which is produced in response to a display data for the row corresponding to a selected scanning electrode.

When organic EL display devices having an organic EL device are driven at a constant current, luminance is gradually reducing with the lapse of time. The higher the initial luminance is, the more greatly the degree of luminance decreases. For example, when the initial luminance is twice, the half luminance lifetime is reduced to about half. Additionally, there is caused a phenomenon that luminance varies from pixel to pixel. This is because the longer light emitting time a pixel has, the darker the pixel becomes. This phenomenon is called "image sticking". When adjacent pixels have a luminance difference of from about 3 to about 5%, the luminance difference can be visually recognized.

When organic EL display devices are energized, the luminance of the organic EL display devices greatly reduces at the initial stage and then is gradually reducing in most cases. In a case wherein the luminance is reducing in that way, when organic EL display devices, which have been driven for some period of time and have had luminance reduced, are newly set at an initial state, the luminance is moderately reducing after the initial state. The treatment wherein organic EL display devices are driven for some period of time to reduce the luminance before the organic EL display devices are practically used (before practical use) is called an aging treatment (hereinbelow, referred to as a lifetime aging treatment).

As the lifetime aging treatment, there is a method wherein the anode strips of an organic EL display device are short-circuited through a lead wire and connected to a voltage applying device, and wherein the cathode strips of the organic EL display device are short-circuited through a lead wire and connected to the voltage applying device (see JP-A-6-20774, paragraphs 0003 and 0006, and FIG. 8). A voltage pulse is applied between the lead wire for connection of the anode strips and the lead wire for connection of the cathode strips from the voltage applying device for a certain period of time.

During fabrication of organic EL display devices, a foreign substance, such as dirt, is mixed into an organic EL layer disposed between an anode strip and a cathode strip, or a projection that is formed on an anode strip intrudes into an organic EL layer in some cases. When electric charges gather at such a foreign substance or projection to locally produce heat during practical use of such defective organic EL display devices, decomposition of an organic substance in the organic EL layer progresses. Finally, the organic substance is broken along with a cathode strip, and short-circuit between the cathode strip and an anode strip (interlayer short-circuit) occurs. When the short-circuit occurs, there is caused a phenomenon that a specific pixel fails to emit light during practical use.

In order to avoid the occurrence of such a phenomenon during practical use, an aging treatment is performed wherein a defective portion with a foreign substance mixed therein is preliminarily put in an insulated state as an electrically open state or in a non-conducting state by oxidation as disclosed in, e.g., JP-A-2003-282253, paragraphs 0004 to 0007 (hereinbelow, referred as to the short-circuit aging treatment). The short-circuit aging treatment is performed by applying a d.c. voltage pulse between the anode strips and the cathode strips.

BRIEF SUMMARY OF THE INVENTION

When an organic EL display device using an organic EL device is fabricated, it is common to form a plurality of organic EL devices on a single large glass substrate. As shown in the process flow chart of FIG. 6, a usual fabrication process performs an organic EL device forming step for forming electrode strips and organic EL layers on a single glass substrate, a sealing step for using an opposite substrate made of, e.g., glass to isolate the organic EL layers from ambient air for protection against, e.g., moisture in each of the organic EL devices, a cutting step for cutting the glass substrate to separate the organic EL devices from one another, an optical film applying step for applying an optical film, such as a circular polarizer, to each of the organic EL devices for prevention of reflection, and a mounting step for mounting peripheral circuits, such as driving circuits, to complete organic EL display devices in this order.

In order to effectively perform the short-circuit aging treatment or the lifetime aging treatment, it is preferred to perform these aging treatments before the cutting step. In order to perform these aging treatments before the cutting step, there is a proposal wherein wires, which are used for application of a voltage for the aging treatments, and which are connectable to a voltage applying device provided outside organic EL display devices, are disposed on a glass substrate with a large number of organic EL devices formed thereon, and wherein the voltage is collectively applied between the anode strips and between the cathode strips of the organic EL devices. The connected state of the anode strips and the connected state of the cathode strips by such wires are eliminated by cutting the wires in the cutting step. By this proposal, it is possible to effectively subject such a large number of organic EL devices to the aging treatments for a short period of time.

However, some of organic EL display devices are fabricated by COG (chip on glass) mounting, wherein organic EL devices and driving circuits are mounded on a single substrate. In some cases, it is difficult to apply the proposal to organic EL display devices to be fabricated by COG mounting.

FIG. 7 is a schematic plan view showing a conventional organic EL display device 200, which is fabricated by COG mounting. In the organic EL display device, a driver IC 8 as a driving circuit has connection pads (not shown) for outputting signals for driving scanning electrodes. The connection pads are formed in the vicinity of both lateral sides of a rear surface of the driver IC. The driver IC 8 has additional connection pads (not shown) for outputting signals for driving data electrodes. The additional connection pads are formed in the vicinity of an upper side of the rear surface of the driver IC. In other words, the driver IC 8 is a surface-mounted IC.

Explanation will be made of a case wherein anode strips serve as the data electrodes, and cathode strips serve as the scanning electrodes. It is difficult to apply the proposed method to a case wherein as shown in FIG. 7, wires (hereinbelow, referred to as data electrode circuitous wires) 10 extend from the upper side of the driver IC 8 to an organic EL device 7, and wires (hereinbelow, referred to as scanning electrode circuitous wires) 11 extend from both lateral sides of the driver IC 8 to the organic EL device 7. This is because it is difficult to ensure that respective routes (wires), which are used to electrically connect all scanning electrode circuitous wires 11 outside of the organic EL display device 200, are provided on a glass sheet.

For this reason, it is necessary to perform the aging treatments after the cutting step in connection with organic EL display devices to be fabricated by COG mounting. In order to perform the aging treatments in this way, the number of organic EL display devices to be driven for the aging treatments increases. In particular, when organic EL display devices having small dimensions, such as 2 by 2 inches, are fabricated, tens of organic EL display devices are divided from a single glass substrate. Such a large number of organic EL display devices need to be subjected to the aging treatments. Additionally, a large number of lead wires need to be provided for connection with the power supply. Accordingly, the aging treatments require much work.

In the organic EL display devices to be fabricated by COG mounting, a voltage for the aging treatments is supplied through the driver ICs mounted on the display devices. However, the driver ICs have a limit in terms of available output voltages. From this viewpoint, in particular, when the short-circuit aging treatment is performed, there is a possibility that a required phenomenon, such as non-conduction of a defective part, fails to be exhibited in a sufficient may.

It is an object of the present invention to solve the problems stated earlier and to provide an organic EL display device capable of being effectively subjected to an aging treatment for a short period of time to reduce the work required for the aging treatment even when the organic EL display device is fabricated by COG mounting.

According to a first aspect of the present invention, there is provided an organic EL display device, which comprises a substrate; an organic EL device mounted on the substrate, the organic EL device including a plurality of data electrodes, a plurality of scanning electrodes and a light emitting layer; a driving circuit mounted on the substrate in the vicinity of one side of an active area of the organic EL device, the driving circuit comprising an integrated circuit for driving the organic EL device; the respective data electrodes being connected to the driving circuit through data electrode circuitous wires; the respective scanning electrodes being connected to the driving circuit through scanning electrode circuitous wires; connection wires for aging being connected to the data electrode circuitous wires or the scanning electrode circuitous wires through conductive layers, the connection wires for aging serving to supply a signal to the data electrode circuitous wires or the scanning electrode circuitous wires from outside the organic EL display device, and the conductive layers being formed in the same layer as a cathode layer including the data electrodes or the scanning electrodes.

According to a second aspect of the present invention, the driving circuit is integrated on a single chip LSI in the organic EL display device defined in the first aspect.

According to a third aspect of the present invention, overlapping portions, where the data electrode circuitous wires or the scanning electrode circuitous wires overlap with the conductive layers, are separated by an insulating film except for connection portions in the organic EL display device defined in the first or the second aspect.

According to a fourth aspect of the present invention, overlapping portions, where the connection wires for aging overlap with the conductive layers, are separated by the insulating film except for connection portions in the organic EL display device defined in the first, the second or the third aspect.

According to a fifth aspect of the present invention, the insulting film is formed in the same step as an insulating layer, which has apertural areas formed therein to be used for defining light emitting areas in the organic EL device in the organic EL display device defined in the third or the fourth aspect.

According to a sixth aspect of the present invention, the conductive layers, which are connected to the respective data electrode circuitous wires or the respective scanning electrode circuitous wires, are separated from another conductive layer in the organic EL display device defined in the third, the fourth or the fifth aspect.

According to a seventh aspect of the present invention, there is provided an organic EL display device, which comprises conductive layers, which are connected to respective data electrode circuitous wires or respective scanning electrode circuitous wires, are separated from another conductive layer by separators.

According to an eighth aspect of the present invention, the separators are made of an insulating film, which is formed in the same step as a step for forming cathode separators to be used for separating scanning electrodes from one another in the organic EL display device defined in the seventh aspect.

According to a ninth aspect of the present invention, there is provided an organic EL display device, which comprises conductive layers, which are connected to respective data electrode circuitous wires or respective scanning electrode circuitous wires, are separated from another conductive layer by individually forming the respective conductive layers by vapor-deposition using a mask.

According to a tenth aspect of the present invention, there is provided an organic EL display device, wherein connection portions, where data electrode circuitous wires or scanning electrode circuitous wires are connected to conductive layers, and connection portions, where connection wires for aging are connected to the conductive layers, are connected by apertural areas formed in an insulating film, respectively.

According to an eleventh aspect of the present invention, there is provided an organic EL display device, wherein connection portions, where data electrode circuitous wires or scanning electrode circuitous wires are connected to conductive layers, and connection portions, where connection wires for aging are connected to the conductive layers, are connected through metal layers containing molybdenum, respectively.

According to a twelfth aspect of the present invention, there is provided an organic EL display device, wherein connection wires for aging are covered with a resin.

According to a thirteenth aspect of the present invention, there is provided an organic EL display device, wherein connection wires for aging are covered with an ultraviolet curing resin.

According to a fourteenth aspect of the present invention, there is provided a method for fabricating an organic EL display device, which comprises connecting connection wires for aging to data electrode circuitous wires or scanning electrode circuitous wires and to common connection wires for aging in respective organic EL display devices, the common connection wires for aging serving to collectively apply a voltage to the data electrode circuitous wires or the scanning electrode circuitous wires in the respective organic EL display devices, before completion of fabrication; and cutting the connection wires for aging and the common connection wires for aging in a cutting step.

According to a fifth aspect of the present invention, an aging treatment is performed before the cutting step in the method defined in the fourteenth aspect.

The present invention is appropriately applicable to a large number of organic EL display devices, which are formed on a single glass substrate by COG mounting.

The present invention can provide an organic EL display device, which is capable of being effectively subjected to the aging treatment for a short period of time to reduce the work required for the aging treatment when the organic EL display device is fabricated by COG mounting.

DETAILED DESCRIPTION OF THE INVENTION

Figure 1:
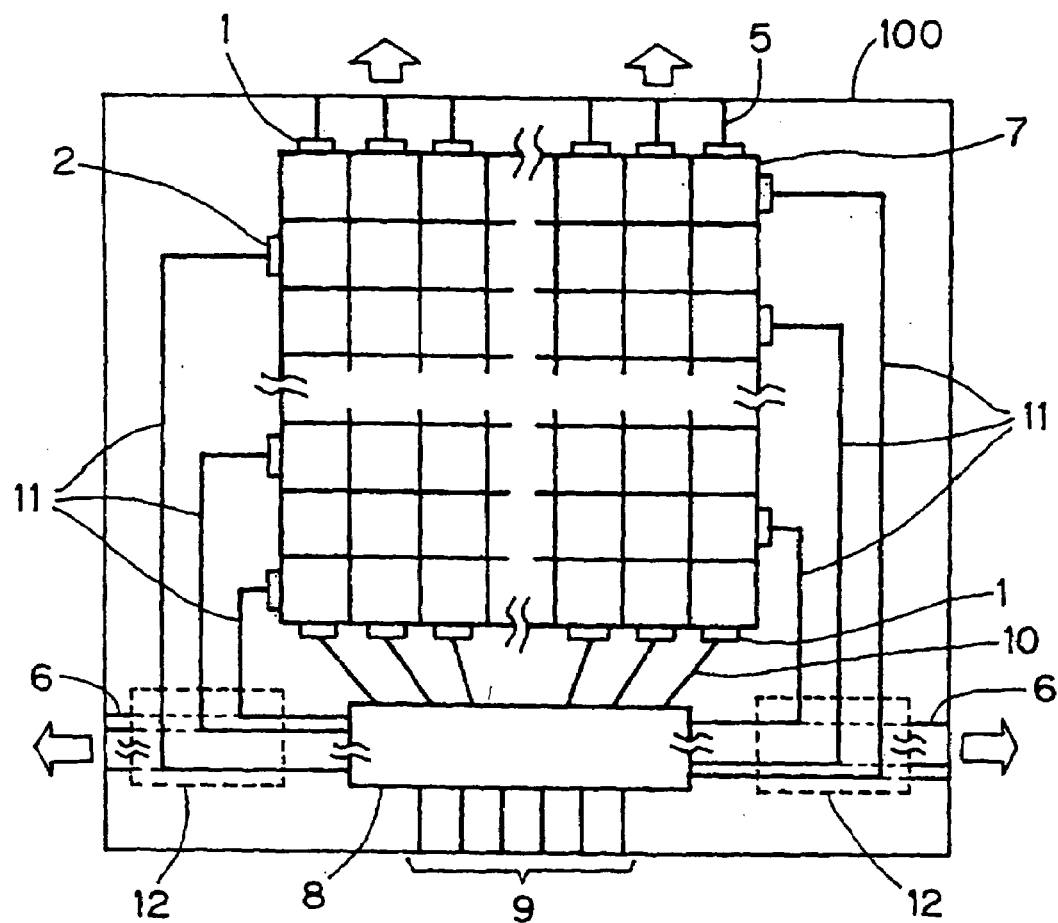
FIG. 1 is a plan view of the organic EL display device according to an embodiment of the present invention.
Figure 2:
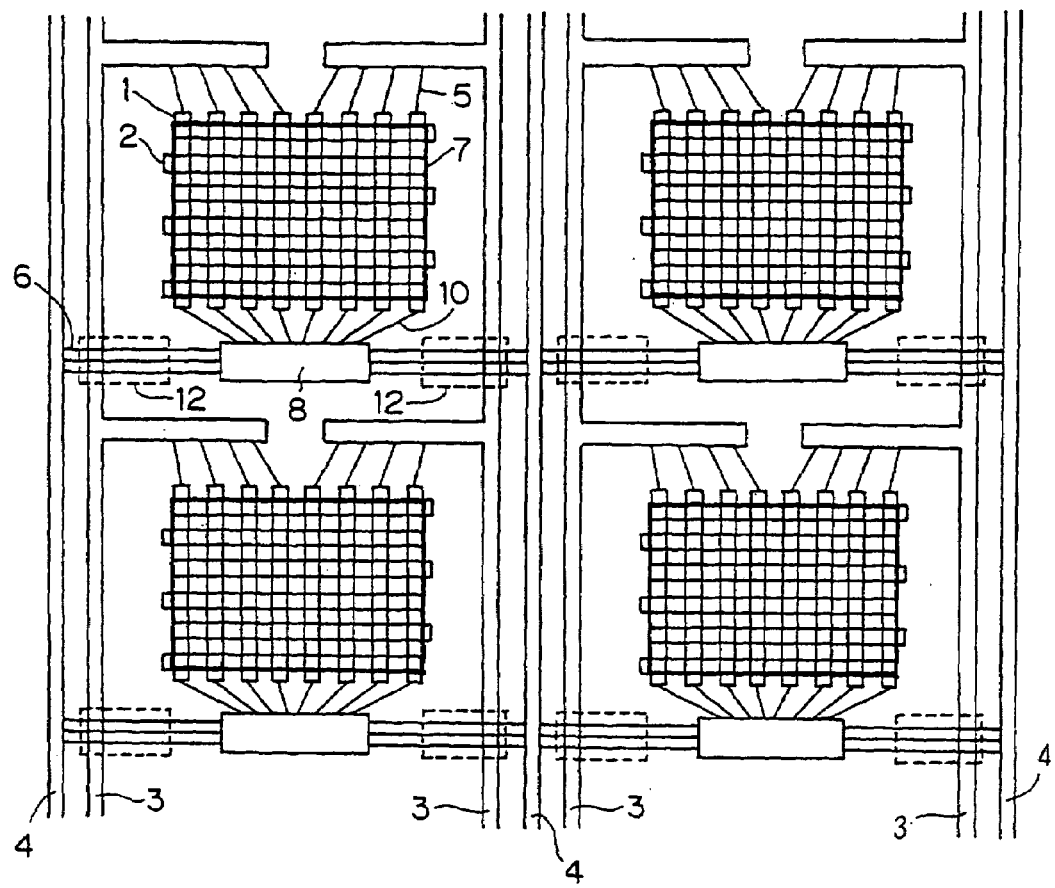
FIG. 2 is a plan view of a plurality of organic EL display devices, which is provided on a single glass substrate.

Now, embodiments of the present invention will be described, referring to the accompanying drawings. FIG. 1 is a plan view of an organic EL display device 100 according to the present invention. FIG. 2 is a plan view of a plurality of organic EL display devices, which is provided on a single glass substrate. Although anode strips and cathode strips serve as data electrodes and scanning electrodes, respectively, in this embodiment, the cathode strips and the anode strips may serve as data electrodes and scanning electrodes, respectively.

As shown in FIG. 1, the organic EL display device 100 has an organic EL device 7 and a driver IC 8 as a single chip LSI mounted thereon. The driver IC 8 has a scanning electrode driving circuit for driving scanning electrodes 2 and a data electrode driving circuit for driving data electrodes 1 incorporated therein. The driver IC 8 has data output terminals connected to the respective data electrodes (the respective anode strips in this embodiment) 1 through data electrode circuitous wires (circuitous wires for the anode strips in this embodiment) 10. The driver IC 8 has scanning output terminals connected to the respective scanning electrodes (the respective cathode strips in this embodiment) 2 through scanning electrode circuitous wires (circuitous wires for the cathode strips in this embodiment) 11. Additionally, the driver IC 8 is provided with signals corresponding to a display data or power from outside the organic EL display device 100 through input signal lines 9, which are provided in the vicinity of a lower side (a side that is located at the lowest position of the four sides shown in FIG. 1) of the driver IC 8.

When an organic EL display device is fabricated, a plurality of organic EL display devices is provided on a single glass substrate as shown in FIG. 2. A wire pattern for first common wires 3, which serve as common wires for aging the data electrodes, and a wire pattern for first common wires 4, which serve as common wires for aging the scanning electrodes, are formed on the glass substrate.

The respective data electrodes 1 of each of the organic EL display devices 100 are connected to first common wires 3 through an upper side (the side opposite the side having ends of the input signal lines 9 among the four sides) of the organic EL display device 100 by data electrode connecting wires 5 as wires for aging connection. All first common wires 3 are electrically connected to one another at a portion on the glass substrate outside the range shown in FIG. 2. Additionally, the respective scanning electrodes 2 of each of the organic EL devices are connected to second common wires 4 through both sides of the organic EL display device 100 by scanning electrode connecting wires 6 as wires for aging connection. All second common wires 4 are electrically connected to one another at a portion on the glass substrate outside the range shown in FIG. 2. Thus, the respective scanning electrodes 2 of all organic EL display devices 100 can be provided with a common signal from the second common wires 4 before a cutting step. The respective data electrodes 1 of all organic EL display devices 100 can be also provided with a common signal from the first common wires 3 before the cutting step. Thus, it is possible to collectively subject a large number of organic EL display devices 100 to an aging treatment.

As shown in FIG. 1, the respective scanning electrode connecting wires 6 are connected to the respective scanning electrode circuitous wires 11, without being directly connected to the respective scanning electrodes 2. In other words, the scanning electrode connecting wires 6 are electrically connected to the scanning electrodes 2 through the scanning electrode circuitous wires 11.

The connection between the first common wires 3 and the data electrode connecting wires 5 is cut in the cutting step. The connection between the second common wire 5 and the scanning electrode connecting wires 6 is also cut in the cutting step.

In FIG. 2, the scanning electrode circuitous wires 11 are not shown. In order to avoid complicated diagrammatic representation, only one or two among a large number of data electrodes, scanning electrodes, data electrode connecting wires, scanning electrode connecting wires and data electrode circuitous wires are indicated by reference numerals in FIG. 1 and FIG. 2.

Figure 7:
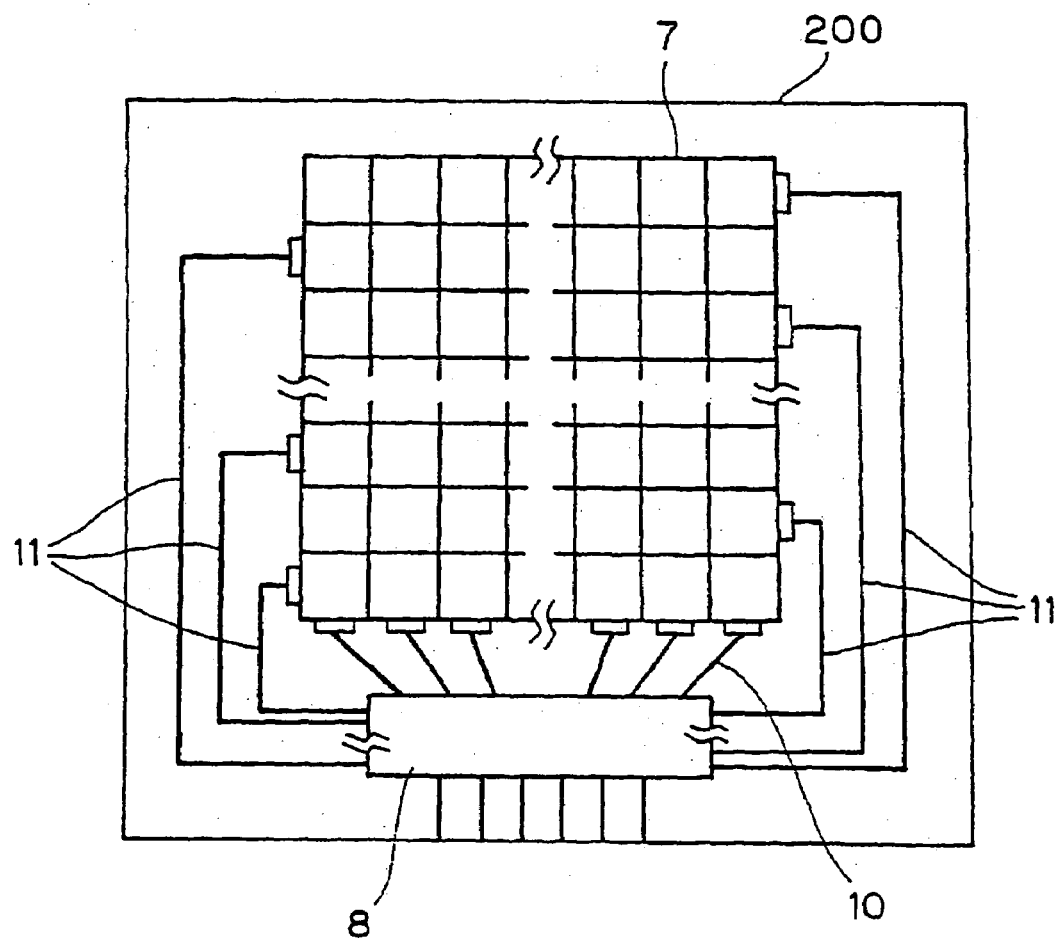
FIG. 7 is a schematic plan view showing a conventional organic EL display device, which is fabricated by COG mounting.

As already stated in reference to FIG. 7, when an attempt is made to make electrical connection of all scanning electrode circuitous wires 11 through the scanning electrode connecting wires 6 at a portion on the glass substrate to be discarded after the cutting step, that is to say, at a portion on the glass sheet outside finally obtained organic EL display devices 100, the scanning electrode connecting wires 6, which extend from the scanning electrode circuitous wires 11 provided inside of each of the organic EL display devices 100 (at a position closer to a central position than the four sides of each of the organic EL display devices 100), cannot extend to both sides of each of the organic EL display devices 100, being blocked by the scanning electrode circuitous wires 11, which are provided outside each of the organic EL display devices 100.

In the layouts shown in FIG. 1 and FIG. 7, the driver ICs 8 as driving circuits have connection pads (not shown) formed on rear surfaces at certain intervals in the vicinity of both lateral sides and in a number corresponding to the number of the scanning electrode circuitous wires 11. It is possible for an extension wire, which extends from a scanning electrode circuitous wire 11 outside the relevant organic EL display device 100, to be formed without having contact with the other scanning electrode circuitous wires 11, making use of the intervals (gaps). However, when each of the gaps is narrow as in, e.g., a case wherein the number of the scanning electrodes 2 is large, it is difficult to form the required extension wires.

From this viewpoint, an extension wire, which is electrically connected to a scanning electrode connecting wire 6, is electrically connected to the corresponding scanning electrode circuitous wire 11, extending so as to cross over the other scanning electrode circuitous wires 11 at a wire crossover portion 12 without having contact with the other scanning electrode circuitous wires 11 in this embodiment. Now, explanation will be made of how an extension wire, which is electrically connected to a scanning electrode connecting wire 6, extends over the other scanning electrode circuitous wires 11 without having contact with the other scanning electrode circuitous wires 11.

Figure 3:
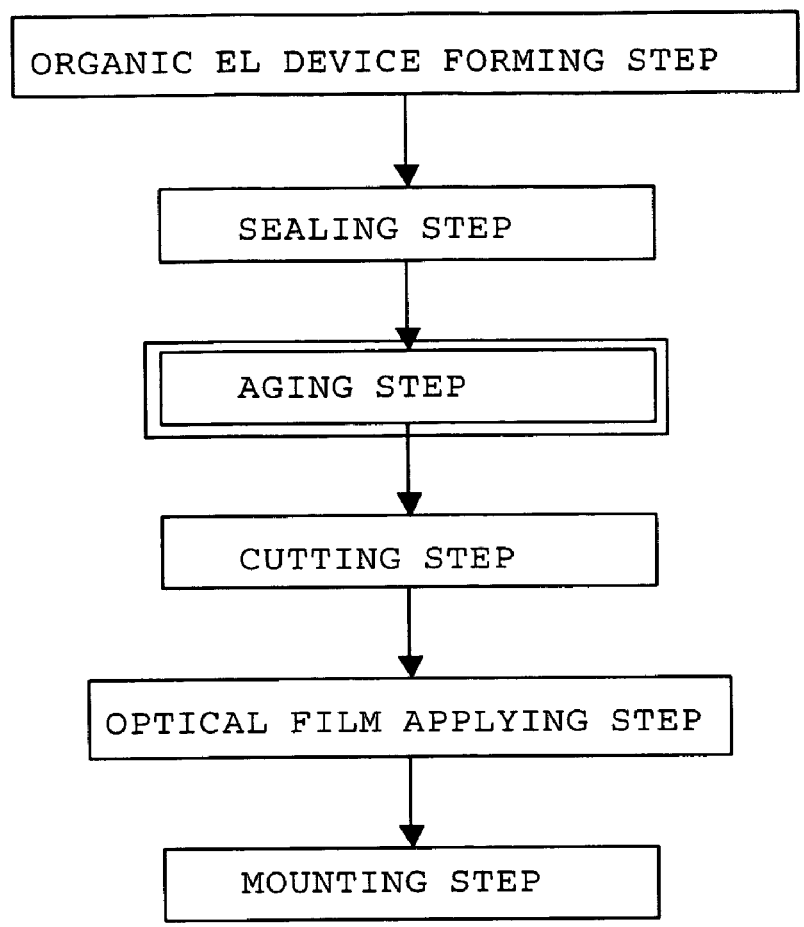
FIG. 3 is a process chart explaining a method for fabricating organic EL display devices according to the present invention.

FIG. 3 is a process chart for explaining an example of the method for fabricating organic EL display devices 100 according to the present invention. In the process shown in FIG. 3, the respective organic EL display devices 100 are fabricated by performing an organic EL device forming step for forming electrodes strips and a plurality of organic EL layers on a single glass substrate, a sealing step for using an opposite substrate made of, e.g., glass to isolate the organic EL layers from ambient air for protection against moisture in each of the organic EL display devices, an aging step for performing an aging treatment to subject the organic EL display devices 100 to aging, a cutting step for cutting the glass substrate to separate the organic EL display devices 100 from one another, an optical film applying step for applying an optical film, such as a circular polarizer, to each of the organic EL display devices for reflection prevention, and a mounting step for mounting driver ICs 8 to the organic EL display devices.

Figure 4A:
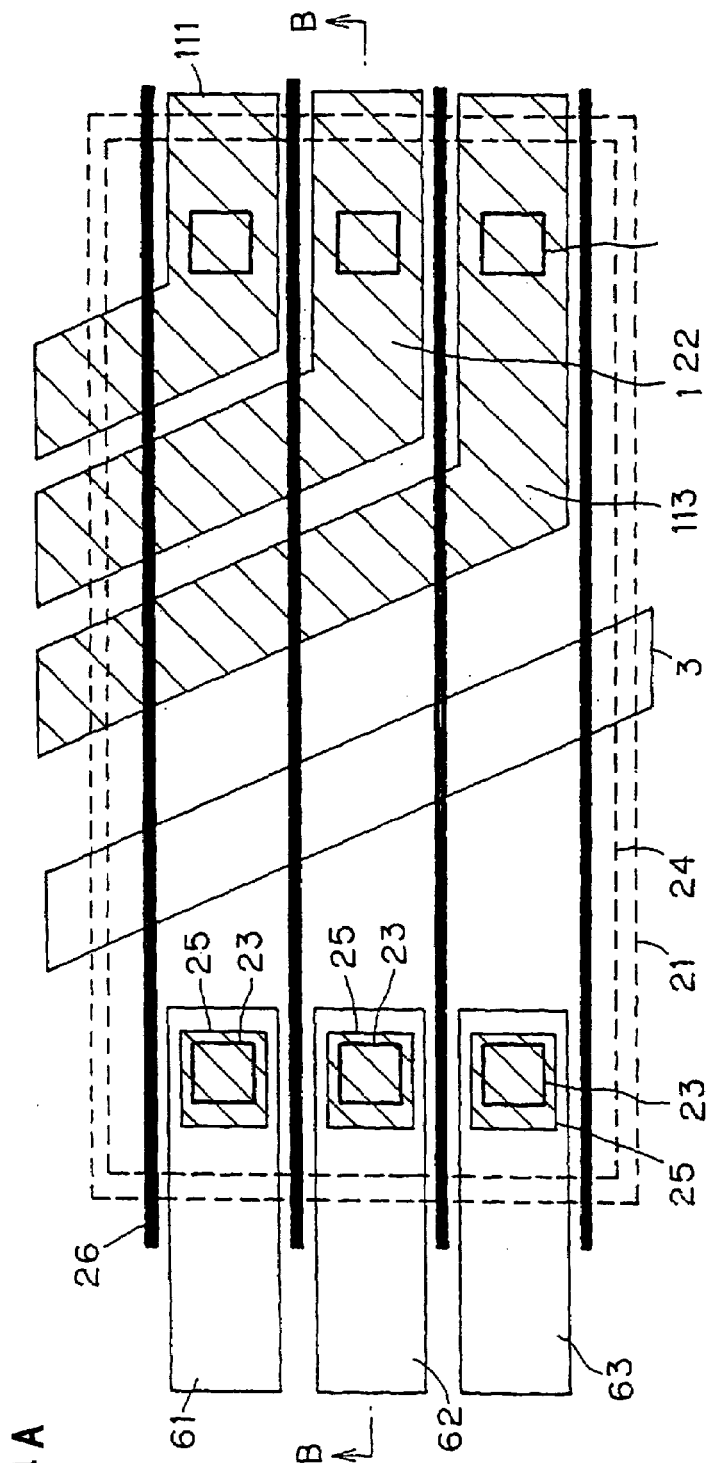
FIG. 4A is a plan view of a wire crossover portion and its surroundings.
Figure 4B:
FIG. 4B is a cross-sectional view taken along the line B—B of FIG. 4A.

FIG. 4A is a plan view showing a wire crossover portion 12 and its surroundings. FIG. 4B is a cross-sectional view taken along the line B—B of FIG. 4A. In FIGS. 4A and 4B, three scanning electrode circuitous wires 111, 112 and 113 and three scanning electrode connecting wires 61, 62 and 63 are shown as an example. The scanning electrode circuitous wires 111, 112 and 113 correspond to scanning electrode circuitous wires 11 shown in FIG. 1. The scanning electrode connecting wires 61, 62 and 63 correspond to scanning electrode connecting wires 6 shown in FIG. 1.

The scanning electrode circuitous wire 111 is electrically connected to the scanning electrode connecting wire 61, the scanning electrode circuitous wire 112 is electrically connected to the scanning electrode connecting wire 62, and the scanning electrode circuitous wire 113 is electrically connected to the scanning electrode connecting wire 63. FIG. 4B shows an area location where the scanning electrode circuitous wire 112 is electrically connected to the scanning electrode connecting wire 62. FIG. 4B also shows an example wherein a metal layer 24, which corresponds to a wire electrically connected to the scanning electrode connecting wire 62, extends so as to cross over the scanning electrode circuitous wire 113 and is electrically connected to the scanning electrode circuitous wire 112. In this embodiment, a first common wire 3 as a common wire for data electrodes is disposed between the scanning electrode circuitous wires 111, 112 and 113 and the scanning electrode connecting wires 61, 62 and 63. For this reason, the wire made of the metal layer 24 is to extend so as to cross over the first common wire 3 as well.

In the organic EL device forming step shown in FIG. 3, an ITO film is deposited on the glass substrate, and the ITO film is etched to form the data electrodes 1, the data electrode connecting wires 5 and the scanning electrode connecting wires 6 (the scanning electrode connecting wires 61, 62 and 63 in the example shown in FIGS. 4A and 4B). Next, a metal film is deposited, and the metal film is etched to form the data electrode circuitous wires 10, the scanning electrode circuitous wires 11 (the scanning electrode circuitous wires 111, 112 and 113 in the example shown in FIGS. 4A and 4B), the first common wires 3, and the second common wires 5. Metal electrodes 25, which are made of an alloy containing molybdenum and have a slightly greater size than holes with an insulating film 23, are formed at locations where the holes with an insulating film 23 are expected to be formed.

An insulating film, which is made of a photosensitive polyimide resin, is applied on the structure thus layered. The insulating film has apertural areas formed to define light emitting areas of the organic EL devices 7. By using the insulating film, an insulating film 21 of each of the wire crossover portions 12 is also simultaneously formed. Then, by performing exposure, development or the like, apertural areas, which serve as light emitting portions in respective pixels, are formed in the organic EL devices 7.

When the apertural areas are formed in the organic EL devices 7, portions of the insulating films 21, which are located at certain positions in the scanning electrode circuitous wires 111, 112 and 113 and at certain positions in the scanning electrode connecting wires 61, 62 and 63, are removed in the respective wire crossover portions 12 to form holes with an insulating film 22 and the holes with an insulating film 23. The certain positions in the scanning electrode connecting wires 61, 62 and 63 are located in ends of the scanning electrode connecting wires 61, 62 and 63 closer to the relevant driver IC 8. It is preferred that the certain positions in the scanning electrode circuitous wires 111, 112 and 113 be located in the vicinity of bent portions of the scanning electrode circuitous wires 111, 112 and 113.

After a negative photosensitive resin (which is used to have exposed portions stayed after exposure) is applied, cathode separators 26 are formed by performing exposure and development. The respective scanning electrodes 2, which are formed in each of screens by vapor-deposition in a subsequent process, are separated by the cathode separators thus formed. The metal layer 24, which is formed in each of the wire crossover portions by vapor-deposition in a subsequent process, is also divided into sections by the cathode separators thus formed. On the substrate having the layered structure thus formed, thin organic films are laminated as organic EL layers. A hole injection layer, a hole transport layer, a light emitting layer, an electron transport layer and an electron injection layer are formed as the thin organic layers in this order. Finally, the cathode strips serving as the scanning electrodes 2 are formed from a metal, such as aluminum, by vapor-deposition.

When the scanning electrodes 2 are formed, the divided sections of the metal layer 24, which is made of the same material as the scanning electrodes 2, are formed simultaneously with the scanning electrodes 2 in the same method as the scanning electrodes 2 in the respective organic EL devices. In other words, the divided sections of the metal layer 24, each of which serves as a conductive layer to connect between the scanning electrode connecting wires 61, 62 or 63 and the scanning electrode circuitous wires 111, 112 or 113, are formed in the same layer as a cathode layer including the scanning electrodes 2. The divided sections of the metal layer 24 are electrically connected to the scanning electrode circuitous wires 111, 112 and 113, respectively, at the positions, each of which has the holes for an insulating film 22 formed therein. The divided sections of the metal layer 24 are electrically connected to the scanning electrode connecting wires 61, 62 and 63, respectively, at the positions, each of which has the holes for an insulating film 23 formed therein.

Thus, the overlapping portions, where the scanning electrode connecting wires 61, 62 and 63 respectively overlap with the divided portions of the metal layer 24, are separated by the insulating film 21 except for the connection portions. The overlapping portions, where the scanning electrode circuitous wires 111, 112 and 113, respectively, overlap with the divided portions of the metal layer 24, are separated by the insulating film 21 except for the connection portions.

By such an arrangement, the divided section of the metal layer 24, which is electrically connected to the scanning electrode circuitous wire 112, extends so as to cross over the scanning electrode circuitous wire 113 and the first common wire 13 and to be electrically connected to the scanning electrode connecting wire 62 through the relevant metal electrode 25 at the wire crossover portion 12. The divided section of the metal layer 24, which is electrically connected to the scanning electrode circuitous wire 111, can extend so as to cross over the scanning electrode circuitous wires 112 and 113 and the first common wire 13 and to be electrically connected to the scanning electrode connecting wire 61 through the relevant metal electrode 25 at the wire crossover portion. The divided section of the metal layer 24, which is electrically connected to the scanning electrode circuitous wire 113, can extend so as to cross over the first common wire 13 and to be electrically connected to the scanning electrode connecting wire 63 through the relevant metal electrode 25 at the wire crossover portion.

Thus, extension wires, which are, respectively, connected to the scanning electrode circuitous wires 111, 112 and 113, can be led out of the relevant organic EL display device 100 without being electrically connected to any one of the other scanning electrode circuitous wires (see FIG. 1). By this arrangement, the respective scanning electrode circuitous wires 111, 112 and 113 can be electrically connected to the relevant common wire 4, which is provided outside the organic EL display device 100.

Although the cathode separators are used to separate the respective scanning electrodes 2 from one another in this embodiment, the scanning electrodes 2 may be separated from one another by being formed as stripes by vapor-deposition using a mask. In the latter case, the separation of the scanning electrode connecting wires 61, 62 and 63 in each of the wire crossover portions 12 is established by forming the respective scanning electrode connecting wires 61, 62 and 63 as stripes by vapor-deposition using a mask, not by the provision of the cathode separators.

When the organic EL device forming step has been completed, an organic EL display device substrate is provided so as to have such a structure that the respective data electrodes 1 in each of the passive matrix organic EL devices formed on the glass substrate are electrically connected to the relevant common wire 3 through the relevant data electrode connecting wires 5 on the glass substrate, and that the respective scanning electrodes 2 in each of the organic EL devices are electrically connected to the relevant second common wire 4 through the relevant scanning electrode connecting wires 6 on the glass substrate.

Next, in order that the organic EL layers, which have been formed on the glass substrate in the organic EL device forming step, are protected against moisture, another glass substrate as a second substrate is provided so as to confront to the first glass substrate, and both glass substrates are bonded together by a peripheral seal as a gap material in each of the organic EL devices. Then, a dry nitrogen gas is sealed in a sealed space, which is defined by the two glass substrates and the peripheral seal.

Next, a short-circuit aging treatment and a lifetime aging treatment are performed in the aging step. In order to energize the data electrodes 1 and the scanning electrodes 2 for aging, the first common wires 3 and the second common wires 4 are connected to a voltage application device for aging. In the short-circuit aging treatment, the energizing voltage is applied so that a reverse bias (wherein the voltage at the scanning electrodes is higher than that at the data electrodes) is greater than that on actual driving. In the life aging treatment, in order to reduce luminance to a desired level for a shorter period of time, the energizing conditions are set so that the luminance of each pixel in the aging treatment is higher than the luminance, which is obtained when the respective organic EL display devices operate at a rated display action. For example, when the organic EL display devices have a required luminance of 200 cd/m$^2$, the organic EL display devices are energized so as to emit light at 400 cd/m$^2$. By energizing the organic EL display devices to emit light with a high luminance, which is twice the required luminance, it is possible to complete the aging step for a half period of time in comparison with the period of time required when the organic EL display devices are subjected to aging at the same luminance as the required luminance.

In the cutting step, the glass substrate is cut to separate the organic EL display devices 100 from one another. At that time, the connection between the first common wires 3 and the data electrode connecting wires 5 is cut, and the connection between the second common wires 4 and the scanning electrode connecting wires 6 is cut, whereby the respective data electrodes 1 and the respective scanning electrodes 2 are separated from the first common wires 3 and the second common wires 4. The data electrode connecting wires 5, the scanning electrode connecting wires 6 and the wire crossover portions 12 remain in the respective organic EL display devices 100. Although the first common wires 3 nor the second common wires 4 have no connection with the data electrode connecting wires 5 or the scanning electrode connecting wires 6, some of the wires remain in the respective organic EL display devices 100.

Next, optical films for prevention of reflection, such as circular polarizers, are applied to the respective organic EL devices in the optical film applying step. Then, in the mounting step, the respective EL display devices 100 are completed by mounting the driver ICs 8 to the respective EL devices and connecting flexible cables to the input signal lines 9 for transmitting external signals to the input signal lines.

In order to protect the surfaces of unsealed portions of the data electrode circuitous wires 10 and the scanning electrode circuitous wires 11, it is preferred that an ultraviolet curing resin be applied the peripheral portion of each of the respective organic EL display devices 100 after the mounting step. At that time, the ultraviolet curing resin is also applied to the divided sections of the metal layer 24 to protect the surface of the divided sections of the metal layer.

In the cutting step, edges of the glass substrate are cut out and discarded. From this viewpoint, when the first common wires 3 and the second common wires 4, which are formed outside the respective organic EL display devices 100, are formed at portions to be cut out, the glass substrate has no waste portions even if the first common wires 3 and the second common wires 4 are formed. When the remaining portions of the first common wires 3 and the second common wires 4 in the respective EL display devices 100 are located in an area where the peripheral seal is formed in the seal step, the glass substrate has no waste portion even if the first common wires 3 and the second common wires 4 are formed.

As explained, according to this embodiment, it is possible to collectively energize the plural organic EL display devices 100 in the aging step. Accordingly, it is possible to reduce the work required for performing an aging treatment. As the first common wires 3 and the second common wires 4, metal wires having a low resistance is used. As the data electrode connecting wires 5 and the scanning electrode connecting wires 6, wires, which are made of a transparent conductive film of ITO having a higher resistance than the metal wires, are used. By using these materials, all organic EL display devices are supplied with a substantially uniform voltage by the first common wires 3 and the second common wires 4.

Since the data electrode connecting wires 5, the scanning electrode connecting wires 6 and the wire crossover portions 12 remain in each of the organic EL display devices 100, a signal can be inputted to the respective data electrodes 1 and the respective scanning electrodes 2 from outside the organic EL display devices 100 through the data electrode connecting wires 5 and the scanning electrode connecting wires 6 before mounting of the driver ICs 8. Thus, the data electrode connecting wires 5, the scanning electrode connecting wires 6 and the wire crossover portions 12 may be utilized for inspection of the organic EL devices before mounting the driver ICs 8.

The metal that is used as the first common wires 3 and the second common wires 4 preferably has a surface resistance of not higher than 0.2 Ω/sq and a wire width of not narrower than 200 μm for the purpose of obtaining low resistance. In consideration of the occupied areas of these common wires on the glass substrate (the occupied areas of cut out portions and the occupied areas in the portions with the peripheral seals formed thereon), the wire width is preferably not wider than 3 mm. As the wire material, it is preferable to use aluminum, a layered structure of aluminum and another metal, or a silver-based alloy. As the data electrode connecting wires 5 and the scanning electrode connecting wires 6, wires, which are made of a transparent conductive film of ITO, may be used. The wires preferably have a surface resistance of not lower than 5 Ω/sq and an aspect ratio (wire length/wire width) of not lower than 20 for the purpose of obtaining high resistance. In consideration of the occupied areas of these connecting wires on the glass substrate, the wire width is preferably not wider than 50 μm since the wire length is preferably not wider than 1 mm.

The resistance of the data electrode connecting wires 5 and the scanning electrode connecting wires 6 is preferably not lower than 100 Ω and not higher than 10 kΩ, more preferably not lower than 500 Ω. In a case wherein the resistance is not lower than 100 Ω, when, e.g., a voltage of 10 V is applied in the aging treatment, the consumption current is as small as about 100 mA. However, in consideration of heat generation in the data electrode connecting wires 5 and the scanning electrode connecting wires 6, the resistance is preferably not lower than 500 Ω. When the resistance is too high, a voltage drop in the data electrode connecting wires 5 and the scanning electrode connecting wires 6 becomes great, which is not preferred.

It is preferred that the resistance of the first common wires 3 and the second common wires 4 be not higher than 10 Ω. This is because it is preferred that a voltage be uniformly applied to the respective organic EL devices in the aging treatment.

Figure 5:
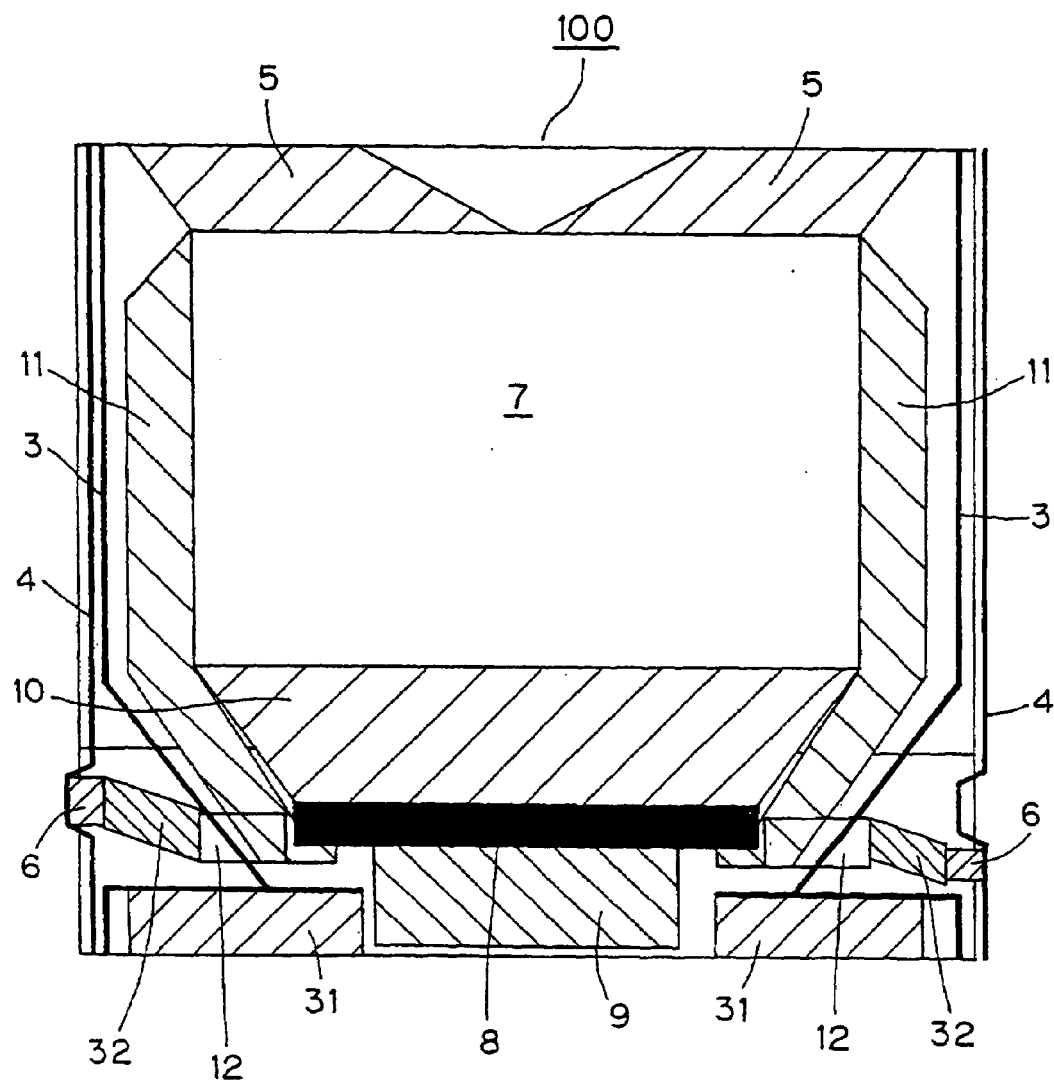
FIG. 5 is a layout chart showing wiring in an organic EL display device according to the present invention.
Figure 6:
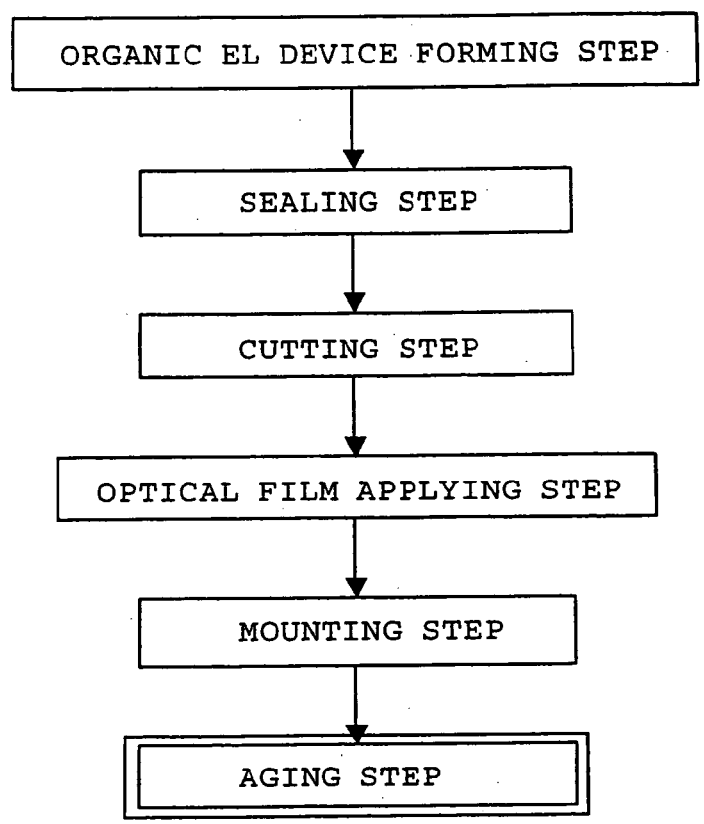
FIG. 6 is a process chart explaining a method for fabricating a conventional organic EL display device.

As shown in the layout chart of FIG. 5, it is preferred that data electrode connecting wire portions 31 and the scanning electrode connecting wire portions 32 be made of ITO. On the glass substrate before cutting, the data electrodes (not shown in FIG. 5), which are formed in a lower part (not shown in FIG. 5, and hereinbelow referred to as the unshown portion) in a portion containing an organic EL display device 100 shown in FIG. 5, are connected to the relevant first common wires 3 through the data electrode connecting wires in the unshown portion and the data electrode connecting wire portions 31, one of which is shown in FIG. 4. The scanning electrodes in the portion shown in FIG. 5 are connected to the relevant second common wires 4 through the relevant scanning electrode circuitous wires 11, the wire crossover portions 12, the scanning electrode connecting wire portions 32 and the scanning electrode connecting wires 6. By this arrangement, the resistance of the first common wires 3 and the second common wires 4 can be relatively reduced. As a result, voltage application can be provided to all organic EL devices in a way much closer to a uniform way by the first common wires 3 and the second common wires 4.

FIG. 5 shows a layout in an organic EL display devices 100 after cutting. As seen from FIG. 5, the remaining portions of the first common wires 3 and the remaining portions of the second common wires 4 in the respective EL display devices 100 are separated from the data electrode connecting wires 5 and the scanning electrode connecting wires 6 in the respective organic EL display devices 100. In FIG. 5, the data electrode connecting wires 5, the scanning electrode connecting wires 6, the input signal lines 9, the data electrode circuitous wires 10, the scanning electrode circuitous wires 11, the scanning electrode connecting wire portions 31 and the data electrode connecting wire portions 32 are shown as regions, respectively.

Although explanation of this embodiment has been made on a case wherein the wire crossover portions 12 are provided for the cathode strips as the scanning electrodes, wire crossover portions may be provided for data electrodes when it is difficult to form wires, which serve to individually lead out the data electrodes outside the organic EL display devices 100. In other words, the present invention is also applicable to the data electrodes.

The entire disclosure of Japanese Patent Application No. 2003-400098 filed on Nov. 28, 2003 including specification, claims, drawings and summary is incorporated herein by reference in its entirety.

What is claimed is:

1. An organic EL display device comprising
   a substrate;
   an organic EL device mounted on the substrate, the organic EL device including a plurality of data electrodes, a plurality of scanning electrodes and a light emitting layer;
   a driving circuit mounted on the substrate in the vicinity of one side of an active area of the organic EL device, the driving circuit comprising an integrated circuit for driving the organic EL device;
   the respective data electrodes being connected to the driving circuit through data electrode circuitous wires;
   the respective scanning electrodes being connected to the driving circuit through scanning electrode circuitous wires;
   connection wires for aging being connected to the data electrode circuitous wires or the scanning electrode circuitous wires through conductive layers, the connection wires for aging serving to supply a signal to the data electrode circuitous wires or the scanning electrode circuitous wires from outside the organic EL display device, and the conductive layers being formed in the same layer as a cathode layer including the data electrodes or the scanning electrodes.

2. The organic EL display device according to claim 1, wherein the driving circuit is integrated on a single chip LSI.

3. The organic EL display device according to claim 1, wherein overlapping portions, where the data electrode circuitous wires or the scanning electrode circuitous wires overlap with the conductive layers, are separated by an insulating film except for connection portions.

4. The organic EL display device according to claim 1, wherein overlapping portions, where the connection wires for aging overlap with the conductive layers, are separated by the insulating film except for connection portions.

5. The organic EL display device according to claim 3, wherein the insulting film is formed in the same step as an insulating layer, which has apertural areas formed therein to be used for defining light emitting areas in the organic EL device.

6. The organic EL display device according to claim 3, wherein the conductive layers, which are connected to the respective data electrode circuitous wires or the respective scanning electrode circuitous wires, are separated from another conductive layer.

* * * * *